United States Patent
Sugahara

(10) Patent No.: US 8,899,729 B2
(45) Date of Patent: Dec. 2, 2014

(54) PIEZOELECTRIC ACTUATOR AND LIQUID TRANSPORT APPARATUS PROVIDED WITH PIEZOELECTRIC ACTUATOR

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 2016 days.

(21) Appl. No.: 12/057,315

(22) Filed: Mar. 27, 2008

(65) Prior Publication Data
US 2008/0239020 A1  Oct. 2, 2008

(30) Foreign Application Priority Data

Mar. 30, 2007 (JP) ................. 2007-091993

(51) Int. Cl.
| | |
|---|---|
| B41J 2/045 | (2006.01) |
| H01L 41/08 | (2006.01) |
| H01L 41/047 | (2006.01) |
| B41J 2/14 | (2006.01) |
| H01L 41/09 | (2006.01) |

(52) U.S. Cl.
CPC ........... *B41J 2/14233* (2013.01); *H01L 41/047* (2013.01); *H01L 41/0973* (2013.01); *B41J 2002/14266* (2013.01)
USPC ............. 347/70; 310/357; 310/366; 310/328; 310/324; 347/68; 347/71; 347/72

(58) Field of Classification Search
CPC ........ H03H 9/173; H03H 9/174; G10K 9/122
USPC ......... 310/324, 328, 359, 366; 347/68, 70–72
See application file for complete search history.

(56) References Cited

U.S. PATENT DOCUMENTS

| | | | |
|---|---|---|---|
| 4,825,227 A * | 4/1989 | Fischbeck et al. | ............. 347/69 |
| 5,764,255 A * | 6/1998 | Tsurui et al. | ................... 347/70 |
| 6,679,588 B2 | 1/2004 | Takahashi | |
| 6,739,704 B2 | 5/2004 | Takahashi | |
| 6,863,383 B2 | 3/2005 | Takahashi | |

(Continued)

FOREIGN PATENT DOCUMENTS

| | | | | |
|---|---|---|---|---|
| JP | 56-133172 A | * | 10/1981 | ................. B41J 3/04 |
| JP | 10-058675 A | | 3/1998 | |

(Continued)

OTHER PUBLICATIONS

Japan Patent Office; Notice of Reasons for Rejection in Japanese Patent Application No. 2007-091993 mailed Jul. 14, 2009.

*Primary Examiner* — Thomas Dougherty
(74) *Attorney, Agent, or Firm* — Baker Botts L.L.P.

(57) ABSTRACT

A piezoelectric actuator includes a vibration plate which is joined to a flow passage unit to cover a pressure chamber formed in the flow passage unit, a piezoelectric layer arranged on the vibration plate, a first electrode arranged on the piezoelectric layer to face the pressure chamber, a second electrode arranged on the piezoelectric layer while being opposed to the first electrode, and a third area arranged in the remaining area of the piezoelectric layer opposed to the pressure chamber. A first portion of the piezoelectric layer interposed by the first and second electrodes is polarized in parallel to the thickness direction. A second portion of the piezoelectric layer disposed between the first and third electrodes in the plane direction, is polarized in parallel to the plane direction. Accordingly, there are provided the piezoelectric actuator having a high driving efficiency.

16 Claims, 11 Drawing Sheets

(56) References Cited

U.S. PATENT DOCUMENTS

| | | | |
|---|---|---|---|
| 6,971,737 B2 * | 12/2005 | Sugahara | 347/68 |
| 7,156,505 B2 * | 1/2007 | Suzuki | 347/72 |
| 7,980,680 B2 * | 7/2011 | Sugahara | 347/70 |
| 7,980,682 B2 * | 7/2011 | Kojima | 347/72 |
| 8,110,963 B2 * | 2/2012 | Funasaka et al. | 310/324 |
| 2006/0214536 A1 | 9/2006 | Sugahara | |

FOREIGN PATENT DOCUMENTS

| | | |
|---|---|---|
| JP | 2002-292869 A | 10/2002 |
| JP | 2002-359410 A | 12/2002 |
| JP | 2003008091 A | 1/2003 |
| JP | 2003-224312 A | 8/2003 |
| JP | 2006-015764 A | 1/2006 |
| JP | 2006304588 A | 11/2006 |

* cited by examiner

SCANNING DIRECTION
PAPER FEEDING DIRECTION

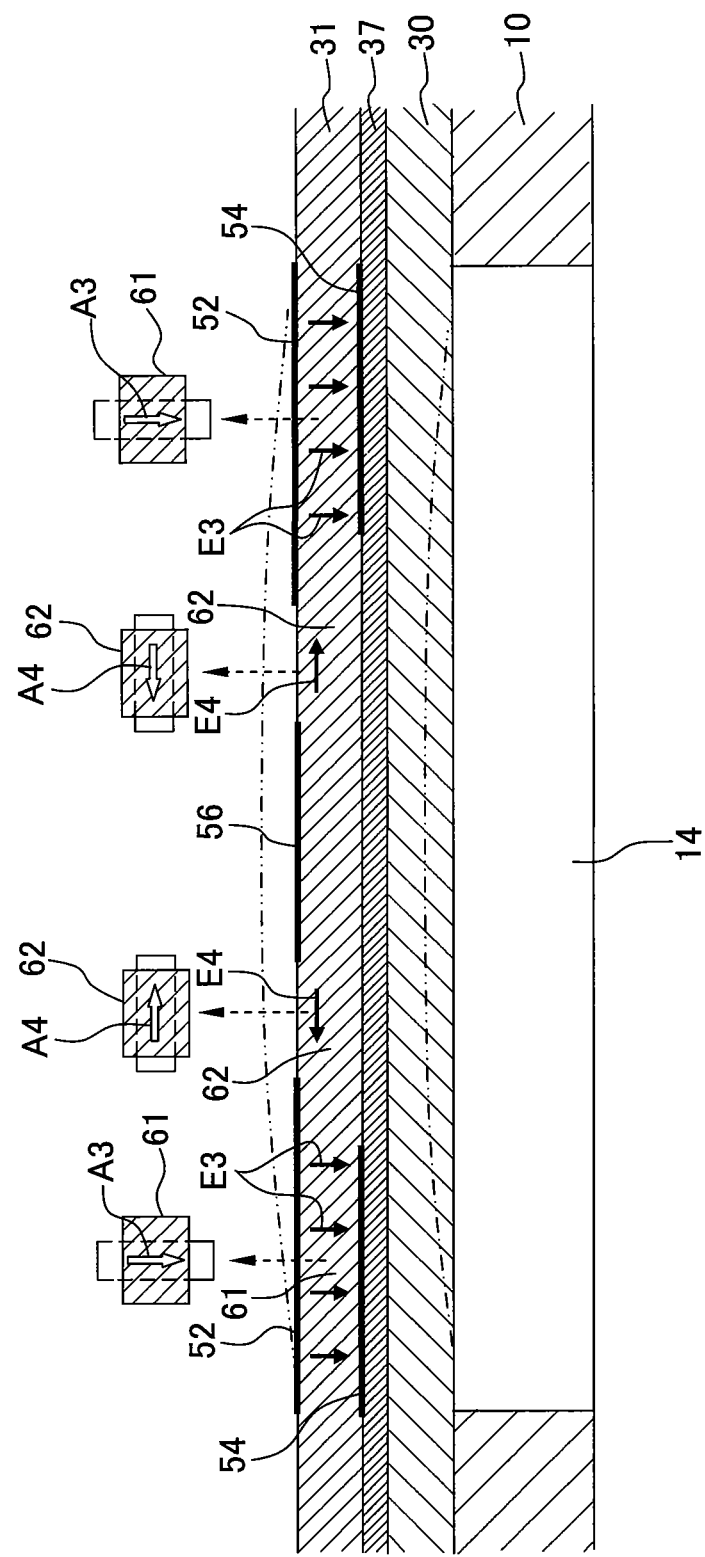

PIEZOELECTRIC ACTUATOR AND LIQUID TRANSPORT APPARATUS PROVIDED WITH PIEZOELECTRIC ACTUATOR

CROSS REFERENCE TO RELATED APPLICATION

The present application claims priority from Japanese Patent Application No. 2007-091993, filed on Mar. 30, 2007, the disclosure of which is incorporated herein by reference in its entirety.

BACKGROUND OF THE INVENTION

1. Field of the Invention

The present invention relates to a piezoelectric actuator, and a liquid transport apparatus provided with the piezoelectric actuator.

2. Description of the Related Art

Piezoelectric actuators have been hitherto known, which drive various objectives by utilizing the deformation of the piezoelectric layer (piezoelectric strain) brought about when the electric field is allowed to act. For example, Japanese Patent Application Laid-open No. 2006-304588 discloses a piezoelectric actuator for an ink-jet head, wherein the piezoelectric actuator is arranged on a surface of a flow passage unit including nozzles and pressure chambers, for applying the jetting pressure to the ink contained in the pressure chambers formed in the flow passage unit. The piezoelectric actuator is an actuator having the so-called unimorph structure. The piezoelectric actuator has a vibration plate which is made of metal and which is joined to one surface of the flow passage unit to cover the plurality of pressure chambers therewith, a piezoelectric layer which is stacked on the vibration plate, and individual electrodes which are formed in areas on a surface of the piezoelectric layer, the areas being opposed to central portions of the pressure chambers.

In this arrangement, the piezoelectric layer is polarized in the thickness direction. When a predetermined driving voltage is applied between the individual electrode and the vibration plate made of metal (common electrode), the electric field, which is parallel to the thickness direction as the direction of polarization, is allowed to act in the piezoelectric layer interposed by the individual electrode and the vibration plate. Accordingly, the piezoelectric layer is elongated or expanded in the thickness direction as the direction of polarization, and the piezoelectric layer is shrunk in the plane direction or the surface direction perpendicular to the direction of polarization. In this situation, the vibration plate is deformed so that the vibration plate is convex toward the side of the pressure chamber in the area facing the pressure chamber in accordance with the shrinkage deformation of the piezoelectric layer in the plane direction (unimorph deformation). Accordingly, the volume in the pressure chamber is decreased, and the pressure is applied to the ink contained in the pressure chamber.

The piezoelectric actuator, which has the conventional unimorph structure as described in Japanese Patent Application Laid-open No. 2006-304588, has involved such a problem that the driving efficiency is low. That is, it is necessary that the high driving voltage (difference in electric potential) should be applied between the individual electrode and the vibration plate in order to generate, in the vibration plate, a predetermined amount of the deformation required to apply the desired jetting pressure to the ink. As a result, a problem arises such that the electric power consumption of the actuator is raised or increased.

SUMMARY OF THE INVENTION

An object of the present invention is to provide a piezoelectric actuator having a higher driving efficiency, and a liquid transport apparatus provided with such an actuator.

According to a first aspect of the present invention, there is provided a piezoelectric actuator including a vibration plate which is deformable; a base member which has a deformation acceptable section in which a deformation of the vibration plate is acceptable, and a surrounding area, surrounding the deformation acceptable section, on which the vibration plate is joined to cover the deformation acceptable section; a piezoelectric layer arranged on one surface of the vibration plate over the deformation acceptable section; a first electrode arranged in a first area of one surface of the piezoelectric layer, the first area facing the deformation acceptable section; a second electrode arranged in a second area of the other surface of the piezoelectric layer, the second area facing the first electrode; and a third electrode arranged in a third area, the third area being an area of the one surface of the piezoelectric layer different from the first area or being an area of the other surface of the piezoelectric layer different from the second area, wherein a first portion and a second portion of the piezoelectric layer are overlapped with the deformation acceptable section, the first portion being interposed by the first electrode and the second electrode in a thickness direction of the piezoelectric layer, and the second portion being interposed by the first electrode and the third electrode in a plane direction of the piezoelectric layer; and the first portion of the piezoelectric layer is polarized in parallel to the thickness direction, and the second portion of the piezoelectric layer is polarized in parallel to the plane direction.

According to the first aspect of the present invention, the first electrode and the second electrode, which are included in the electrodes provided in the areas of the piezoelectric layer overlapped with the deformation acceptable section, are arranged on the both surfaces of the piezoelectric layer respectively, and they are opposed to one another. The first electrode and the third electrode are arranged in the areas which are different from each other in the plane direction of the piezoelectric layer. Therefore, the electric field parallel to the thickness direction is generated at the portion of the piezoelectric layer interposed by the first electrode and the second electrode, and the electric field parallel to the plane direction is generated between the first electrode and the third electrode, in a state in which the electric potential of the first electrode is different from the electric potential of the second electrode and the electric potential of the third electrode.

Further, the piezoelectric layer is polarized in the thickness direction between the first electrode and the second electrode. Therefore, both of the directions of the electric field and the polarization are parallel to the thickness direction at this portion. The piezoelectric layer is elongated in the thickness direction, and it is shrunk in the plane direction. On the other hand, the piezoelectric layer is polarized in the plane direction between the first electrode and the third electrode. Therefore, both of the directions of the electric field and the polarization are parallel to the plane direction at this portion (second portion). The piezoelectric layer is elongated in the plane direction, and it is shrunk in the thickness direction.

As described above, the different types of deformation can be caused respectively in one area of the piezoelectric layer interposed between the first electrode and the second electrode and another area interposed between the first electrode and the third electrode in the plane direction. Accordingly, the vibration plate can be deformed to a great extent even when the difference in electric potential between the first electrode and the second electrode, and between the first electrode and the third electrode is suppressed to be low. That is, the driving efficiency of the piezoelectric actuator is improved. In this specification, the phrase "piezoelectric layer is polarized in a certain direction" includes not only the situation in which the piezoelectric layer is polarized completely in the direction but also the situation in which the piezoelectric layer has the component of polarization in the direction as a whole and the piezoelectric layer is substantially polarized in the direction. In other words, the phrase "piezoelectric layer is polarized in the plane direction" means the fact that the direction of polarization of the piezoelectric layer resides in the substantial polarization in the plane direction as a whole.

In the piezoelectric actuator of the present invention, the third electrode may be formed in an local area which is included in the third area of the piezoelectric layer and which faces the deformation acceptable section; and an electric field parallel to the thickness direction of the piezoelectric layer may be generated in the first portion of the piezoelectric layer and an electric field parallel to the plane direction of the piezoelectric layer may be generated in the second portion of the piezoelectric layer when an electric potential of the first electrode is different from an electric potential of the second electrode and an electric potential of the third electrode. In this case, the third electrode is formed in the area of the piezoelectric layer opposed to the deformation acceptable section. The third electrode can be formed continuously, for example, in the entire area of one surface of the piezoelectric layer except for the first electrode and the surroundings thereof. In this case, for example, the first and third electrodes can be formed simultaneously such that a metal film is formed on the entire one surface of the piezoelectric layer, and then the metal film, which is disposed around the portion to be converted into the first electrode, is removed, for example, by means of the laser processing or machining. It is possible to lower the production cost.

In the piezoelectric actuator of the present invention, the second electrode may be arranged on the other surface of the piezoelectric layer to be accommodated in an area facing the first electrode. In this case, the second electrode is formed to have the shape which is one size smaller than that of the first electrode, and the second electrode is arranged so that the second electrode is accommodated in the area opposed to the first electrode. Therefore, a dispersion (leakage) in the plane direction of the electric field, which is generated between the first electrode and the second electrode, is suppressed. Accordingly, the interference between the electric field and another electric field, which is generated between the first electrode and the third electrode and which is parallel to the plane direction, is prevented.

In the piezoelectric actuator of the present invention, the vibration plate may be formed of a metal material; and an insulating material layer may be arranged between the vibration plate and the piezoelectric layer. In this case, the insulating material layer is allowed to intervene between the vibration plate and the piezoelectric layer. Therefore, it is possible to avoid such a situation that any external electric field, which is distinct from the electric fields generated by the three electrodes, is applied to the piezoelectric layer through the vibration plate.

In the piezoelectric actuator of the present invention, the first area of the piezoelectric layer may face a central portion of the deformation acceptable section; and the third area may surround the first area and faces a circumferential edge portion of the deformation acceptable section.

In this arrangement, the piezoelectric layer is shrunk in the plane direction in the area opposed to the central portion of the deformation acceptable section. Further, the piezoelectric layer is elongated in the plane direction in the area which is disposed therearound and which is opposed to the circumferential edge portion of the deformation acceptable section. Accordingly, the vibration plate can be deformed greatly to be convex toward the side of the deformation acceptable section, even when the electric potential difference between the first electrode and the second electrode, and between the first electrode and the third electrode is suppressed.

In the piezoelectric actuator of the present invention, the first area of the piezoelectric layer may face a circumferential edge portion of the deformation acceptable section and may surround a central portion of the deformation acceptable portion; and the third area may face the central portion of the deformation acceptable section surrounded by the first area.

In this arrangement, the piezoelectric layer is shrunk in the plane direction in the area opposed to the circumferential edge portion of the deformation acceptable section. Further, the piezoelectric layer is elongated in the plane direction in the area which is disposed at the inside of the area opposed to the circumferential edge portion and which is opposed to the central portion of the deformation acceptable section. Accordingly, the vibration plate can be deformed greatly to be convex toward the side opposite to the deformation allowable section, even when the electric potential difference between the first electrode and the second electrode, and between the first electrode and the third electrode is suppressed.

In the piezoelectric actuator of the present invention, the third electrode may be arranged on the one surface of the piezoelectric layer together with the first electrode. Alternatively, the third electrode may be arranged on the other surface of the piezoelectric layer together with the second electrode. In any case, the third electrode can be formed simultaneously with the first electrode or the second electrode.

The piezoelectric actuator of the present invention may further include a power source which applies, to the first, second, and third electrodes, a predetermined reference electric potential or a driving electric potential which is different from the reference electric potential, and the power source may switchably apply the reference electric potential and the driving electric potential to the first electrode, and may apply the reference electric potential to the second and third electrodes at all times. In this case, it is possible to decrease the types of the electric potentials to be applied to the three types of the electrodes, because the electric potentials of the second electrode and the third electrode are always kept to the reference electric potential of the first electrode as described above. It is possible to reduce the cost of the electrical energy transmission system including, for example, the power source and the wirings.

In the piezoelectric actuator of the present invention, the first electrode and the third electrodes may be formed as a plurality of first electrodes and third electrodes, respectively, and the first electrodes and the third electrodes may be arranged alternately at spacing distances therebetween in the plane direction of the piezoelectric layer. When the first electrodes and the third electrodes are alternately arranged in the plane direction of the piezoelectric layer as described above, then the spacing distance in the plane direction between the first electrode and the third electrode is narrowed, and the electric field in the in-plane direction, which is generated in the piezoelectric layer between the first electrode and the third electrode, is strengthened. Therefore, the concerning portion of the piezoelectric layer can be deformed greatly.

In the piezoelectric actuator of the present invention, the first electrode may be arranged in a facing area, of the first area of the piezoelectric layer, facing a central portion of the deformation acceptable section; the third electrode may be arranged around the first electrode in the third area of the piezoelectric layer; and an electric field parallel to the thickness direction of the piezoelectric layer may be generated in the first portion of the piezoelectric layer and an electric field parallel to the plane direction of the piezoelectric layer may be generated in the second portion of the piezoelectric layer when an electric potential of the first electrode is different from an electric potential of the second electrode and an electric potential of the third electrode.

In this arrangement, the different types of the deformation can be caused respectively in the first portion and the second portion of the piezoelectric layer, the first portion facing the pressure chamber (deformation acceptable section) and being interposed by the first electrode and the second electrode, and the second portion facing the pressure chamber and being interposed by the first electrode and the third electrode in the plane direction. Accordingly, the vibration plate can be deformed to a great extent while suppressing the difference in the electric potential between the first electrode and the second electrode and between the first electrode and the third electrode to be low. In other words, the driving efficiency of the piezoelectric actuator is improved.

In the piezoelectric actuator of the present invention, the piezoelectric layer may be formed of a single layer. In this case, the piezoelectric layer can be easily deformed, because the rigidity of the piezoelectric layer is low.

In the piezoelectric actuator of the present invention, the third electrode may include a plurality of individual electrodes aligned in the plane direction of the piezoelectric layer, and a portion of the piezoelectric layer, which is interposed by two individual electrodes among the individual electrodes arranged adjacently in the plane direction, may be polarized in parallel to the plane direction. In this case, the area of the piezoelectric layer, which is deformed by using the third electrode, is increased. Therefore, it is possible to increase the deformation amount of the piezoelectric actuator.

According to a second aspect of the present invention, there is provided a liquid transport apparatus which transports a liquid; including: a flow passage unit having a liquid flow passage including a pressure chamber which is open on one surface of the flow passage unit, and a piezoelectric actuator which is arranged on the one surface of the flow passage unit, the piezoelectric actuator including: a vibration plate which is joined to the one surface of the flow passage unit to cover the pressure chamber; a piezoelectric layer which is arranged on one surface of the vibration plate to face the pressure chamber; a first electrode arranged in a first area of one surface of the piezoelectric layer, the first area facing the pressure chamber; a second electrode arranged in a second area of the other surface of the piezoelectric layer, the second area facing the first electrode; and a third electrode arranged in a third area, the third area being an area of the one surface of the piezoelectric layer different from the first area or being an area of the other surface of the piezoelectric layer different from the second area, wherein a first portion and a second portion of the piezoelectric layer are overlapped with the pressure chamber, the first portion being interposed by the first electrode and the second electrode in a thickness direction of the piezoelectric layer, and the second portion being interposed by the first electrode and the third electrode in an plane direction of the piezoelectric layer; and the first portion of the piezoelectric layer is polarized in parallel to the thickness direction, and the second portion of the piezoelectric layer is polarized in parallel to the plane direction.

According to the second aspect of the present invention, the mutually different types of deformation can be caused respectively in the area interposed by the first electrode and the second electrode and another area disposed between the first electrode and the third electrode in the plane direction of the piezoelectric layer. Therefore, the vibration plate can be greatly deformed while suppressing the difference in the electric potential between the first electrode and the second electrode and between the first electrode and the third electrode to be low. In other words, the driving efficiency of the piezoelectric actuator is raised or enhanced. The high pressure can be applied to the liquid at the low driving voltage.

According to the present invention, the different types of deformation can be caused respectively in the first portion and the second portion of the piezoelectric layer, the first portion facing the pressure chamber (the deformation acceptable section) and being interposed by the first electrode and the second electrode arranged on the both surfaces of the piezoelectric layer respectively, and the second portion facing the pressure chamber (the deformation acceptable section) and being interposed by the first electrode and the third electrode in the plane direction. Therefore, the vibration plate can be deformed to a great extent while suppressing the voltage between the first electrode and the second electrode and between the first electrode and the third electrode to be low. That is, the piezoelectric actuator having the high driving efficiency is obtained.

BRIEF DESCRIPTION OF THE DRAWINGS

FIG. 12 shows a partial magnified sectional view illustrating a piezoelectric actuator 5E of a fifth modified embodiment.

DESCRIPTION OF THE PREFERRED EMBODIMENTS

Next, an embodiment of the present invention will be explained. This embodiment is an example in which the present invention is applied to an ink-jet head provided as the liquid transport apparatus which transports an ink to the nozzle and jets the ink from the nozzle to the recording paper.

Figure 1:
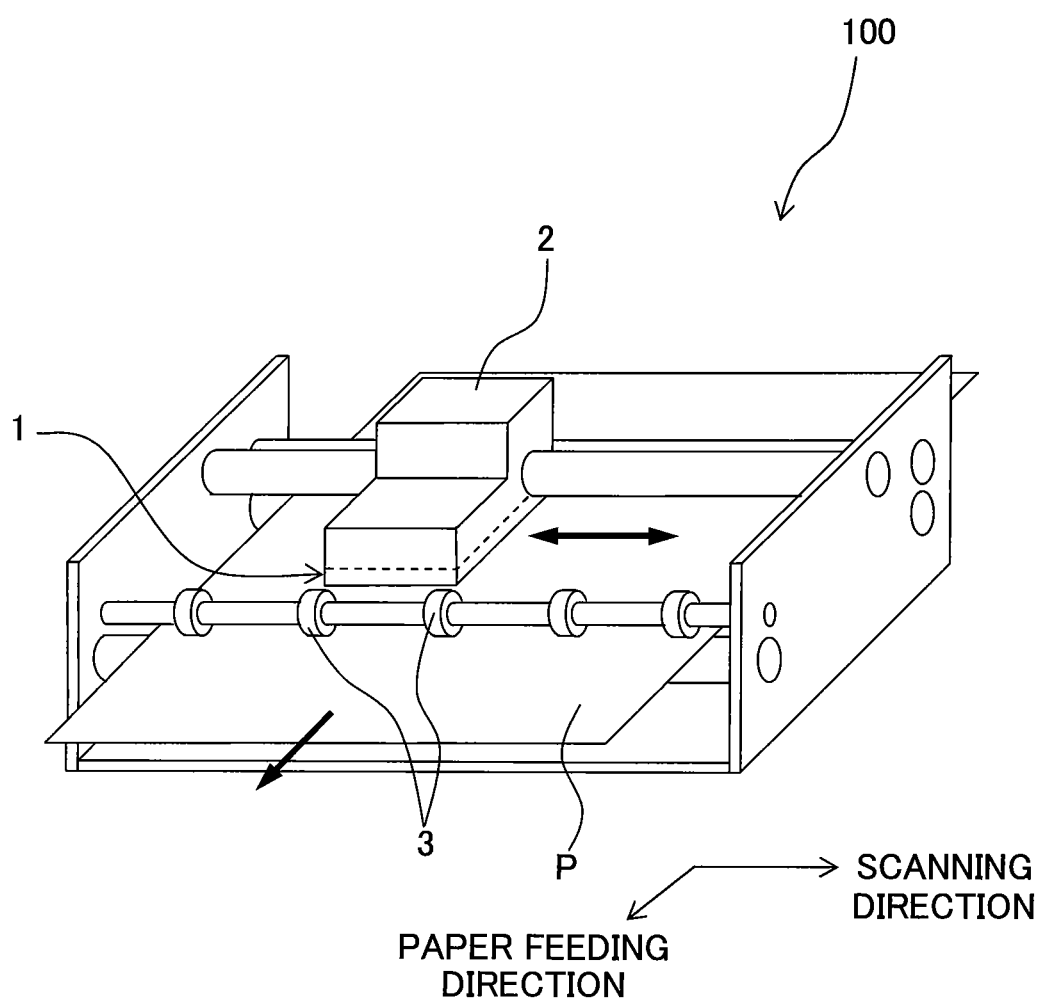
FIG. 1 shows a schematic structure of an ink-jet printer according to an embodiment of the present invention.

At first, an ink-jet printer 100 provided with the ink-jet head 1 of this embodiment will be explained. As shown in FIG. 1, the ink-jet printer 100 comprises a carriage 2 which is movable in the left-right direction as shown in FIG. 1, the serial type ink-jet head 1 which is provided on the carriage 2 to jet the ink to the recording paper P, and transport rollers 3 which transport the recording paper P in the frontward direction as shown in FIG. 1.

The ink-jet head 1 is moved in the left-right direction integrally with the carriage 2, while the ink, which is supplied from an unillustrated ink cartridge, is jetted to the recording paper P from nozzles 20 (see FIGS. 2 to 6) formed on the lower surface thereof. On the other hand, the transport rollers 3 transport the recording paper P in the frontward direction as shown in FIG. 1. Accordingly, the ink-jet printer 100 records, for example, any desired image and/or letters on the recording paper P by transporting the recording paper P in the frontward direction by means of the transport rollers 3 while jetting the ink onto the recording paper P from the nozzles 20 of the ink-jet head 1.

Next, the ink-jet head 1 will be explained in detail. As shown in FIGS. 2 to 5, the ink-jet head 1 is provided with a flow passage unit 4 which is formed with ink flow passages including the nozzles 20 and pressure chambers 14, and a piezoelectric actuator 5 which jets the ink from the nozzles 20 of the flow passage unit 4 by applying the pressure to the ink contained in the pressure chambers 14.

Figure 4:
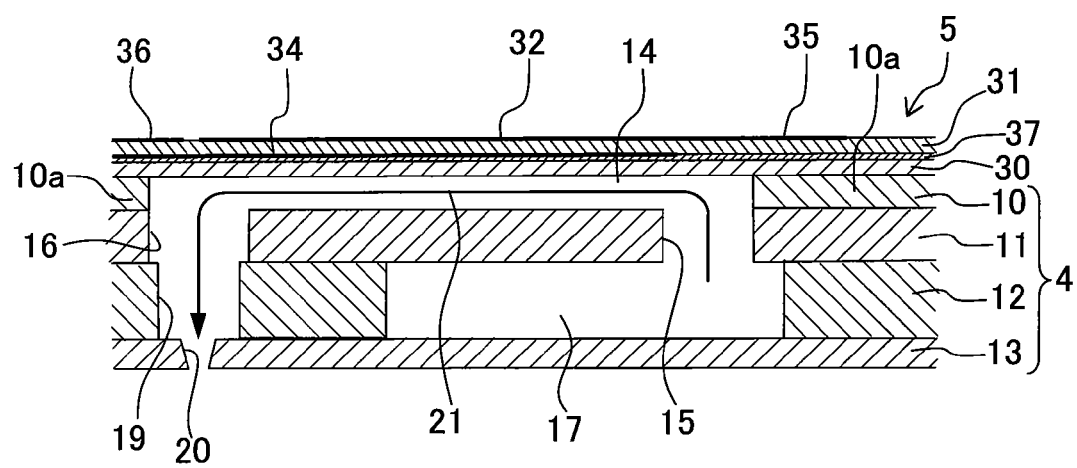
FIG. 4 shows a sectional view taken along a line IV-IV shown in FIG. 3.
Figure 5:
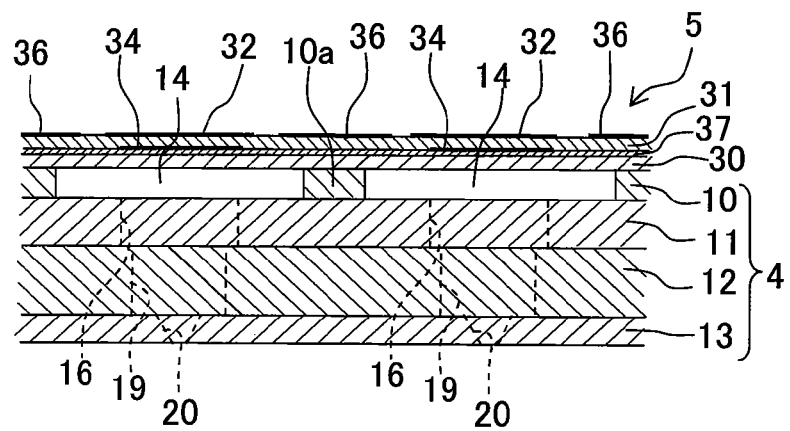
FIG. 5 shows a sectional view taken along a line V-V shown in FIG. 3.

At first, the flow passage unit 4 will be explained. As shown in FIGS. 4 and 5, the flow passage unit 4 includes a cavity plate 10, a base plate 11, a manifold plate 12, and a nozzle plate 13. The four plates 10 to 13 are joined to one another in a stacked state. The cavity plate 10, the base plate 11, and the manifold plate 12 are the metal plates composed of stainless steel or the like. Therefore, the ink flow passages, which include, for example, manifolds 17 and the pressure chambers 14 as described later on, can be easily formed for the three plates 10 to 12 by means of the etching. The nozzle plate 13 is formed of, for example, a high molecular weight synthetic resin material such as polyimide, which is adhered to the lower surface of the manifold plate 12. Alternatively, the nozzle plate 13 may be also a metal plate composed of stainless steel or the like in the same manner as the cavity plate 10, the base plate 11, and the manifold plate 12.

Figure 2:
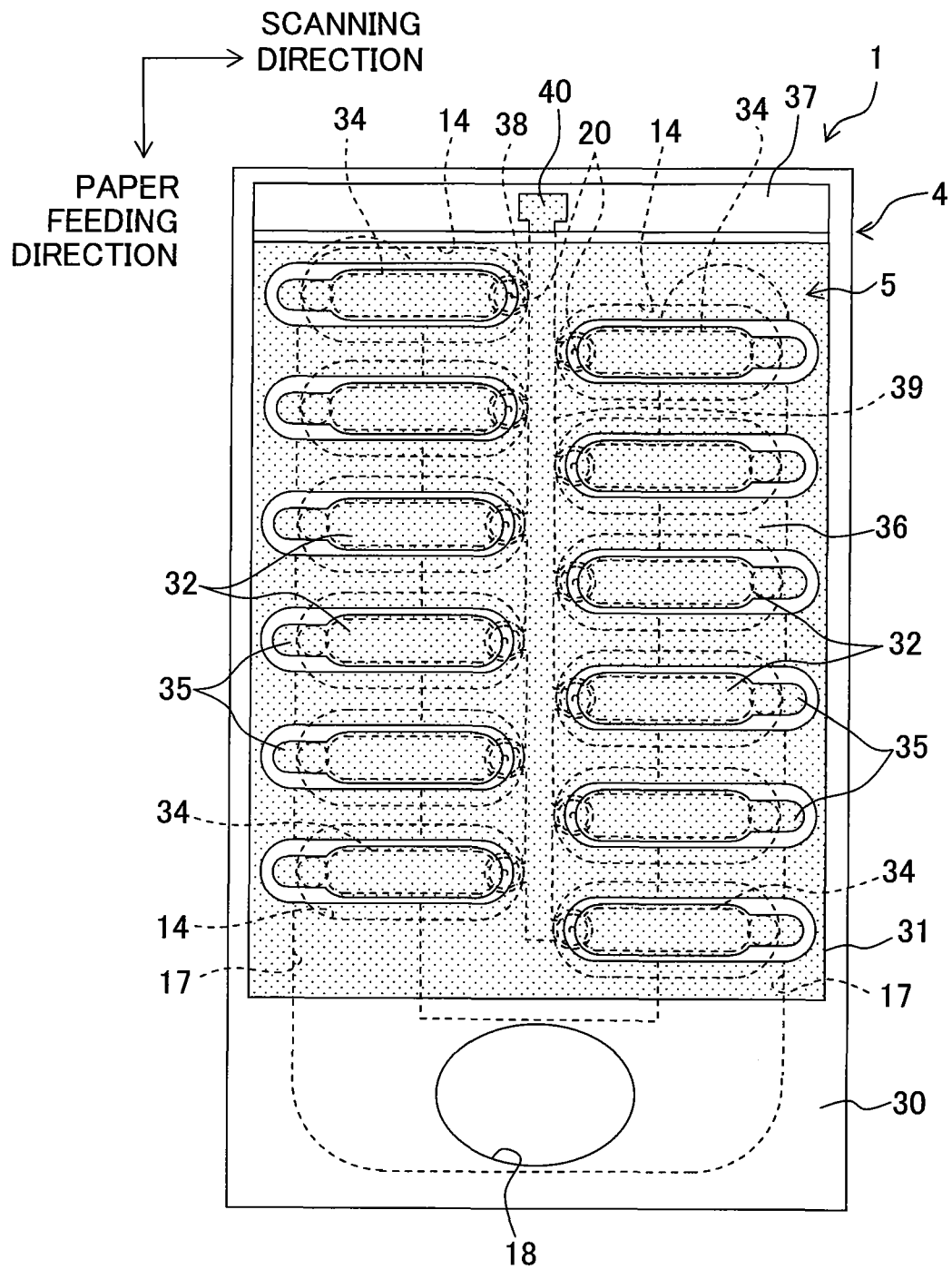
FIG. 2 shows a plan view illustrating an ink-jet head.

As shown in FIGS. 2 to 5, holes, which penetrate through the plate 10 in the vertical direction, are formed through the cavity plate 10 which is included in the four plates 10 to 13 and which is positioned at the uppermost position. The plurality of pressure chambers 14, which are arranged along the plane, are formed by the holes. As shown in FIG. 5, the adjoining pressure chambers 14 are comparted or partitioned by partition walls 10a. Each of the pressure chambers 14 is formed to have a substantially elliptic shape which is elongated in the scanning direction (left-right direction as shown in FIG. 2) as viewed in a plan view. The plurality of pressure chambers 14 are arranged in two arrays in a staggered form in the paper feeding direction (upward-downward direction as shown in FIG. 2).

The lower portions of the plurality of pressure chambers 14 formed for the cavity plate 10 are covered with the base plate 11. The plurality of pressure chambers 14 are open on the upper surface of the flow passage unit 4 respectively. Further, a vibration plate 30 of the piezoelectric actuator 5 described later on is joined to the upper surface of the flow passage unit 4, and thus the plurality of pressure chambers 14 are covered with the piezoelectric actuator 5 disposed at the upper position.

Figure 3:
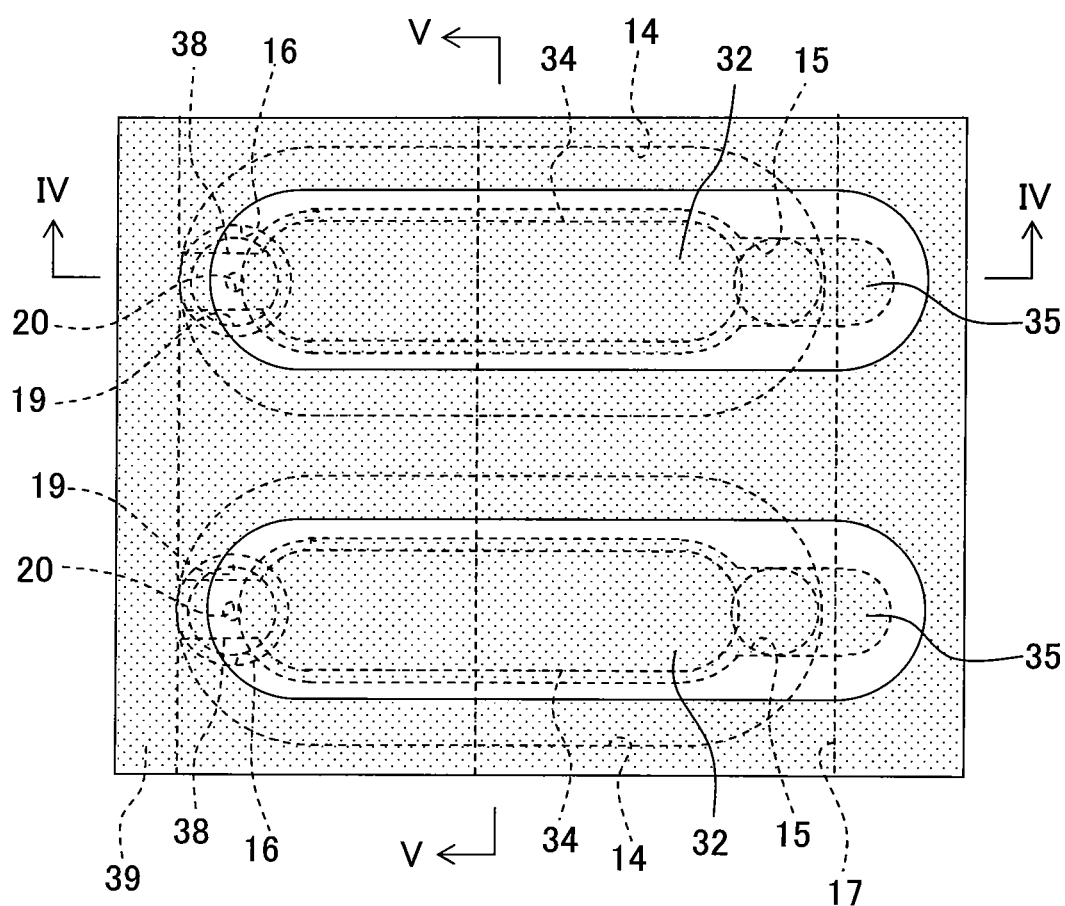
FIG. 3 shows a partial magnified plan view illustrating the ink-jet head shown in FIG. 2.

As shown in FIGS. 3 and 4, communication holes 15, 16 are formed at positions of the base plate 11, the positions being overlapped with the both ends of the pressure chambers 14 as viewed in a plan view respectively. The two manifolds 17, which extend in the paper feeding direction, are formed in areas of the manifold plate 12 overlapped with portions of the pressure chambers 14 arranged in two arrays disposed on the side of the communication holes 15 as viewed in a plan view. The two manifolds 17 are communicated with an ink supply port 18 formed for the vibration plate 30 as described later on. The ink is supplied to the manifolds 17 via the ink supply port 18 from an unillustrated ink tank. Further, a plurality of communication holes 19, which are connected to the plurality of communication holes 16 respectively, are formed at positions of the manifold plate 12 overlapped with the ends of the plurality of pressure chambers 14 disposed on the side opposite to the manifolds 17 as viewed in a plan view.

The plurality of nozzles 20 are formed respectively at the positions of the nozzle plate 13 overlapped with the plurality of communication holes 19 as viewed in a plan view. As shown in FIG. 2, the plurality of nozzles 20 are arranged so that the plurality of nozzles 20 are overlapped respectively with the ends, of the plurality of pressure chambers 14, disposed on the sides opposite to the manifolds 17, the plurality of pressure chambers 14 being arranged in two arrays in the paper feeding direction. In other words, the plurality of nozzles 20 are arranged in two arrays in a staggered form corresponding to the plurality of pressure chambers 14 respectively.

As shown in FIG. 4, the manifold 17 is communicated with the pressure chamber 14 via the communication hole 15. Further, the pressure chambers 14 are communicated with the nozzles 20 via the communication holes 16, 19, respectively. As described above, a plurality of individual ink flow passages 21, which range from the manifolds 17 via the pressure chambers 14 to arrive at the nozzles 20, are formed in the flow passage unit 4.

Next, the piezoelectric actuator 5 will be explained. As shown in FIGS. 2 to 6, the piezoelectric actuator 5 includes the vibration plate 30 which is arranged on the upper surface of the cavity plate 10 to cover the plurality of pressure chambers 14 therewith, an insulating material layer 37 which covers the upper surface of the vibration plate 30, a piezoelectric layer 31 which is arranged on the upper surface of the vibration plate 30 covered with the insulating material layer 37, electrodes (first electrodes 32) and an electrode (third electrode 36) which are arranged on the upper surface of the piezoelectric layer 31, and electrodes (second electrodes 34) which are arranged on the lower surface of the piezoelectric layer 31 (between the insulating material layer 37 and the piezoelectric layer 31).

The vibration plate 30 is a metal plate which has a substantially rectangular shape as viewed in a plan view. The vibration plate 30 is composed of, for example, iron-based alloy such as stainless steel, copper-based alloy, nickel-based alloy, or titanium-based alloy. As shown in FIGS. 4 and 5, the vibration plate 30 is arranged on the upper surface of the cavity plate 10 to cover the plurality of pressure chambers 14 therewith. The lower surface of the vibration plate 30 is joined to the partition walls 10a of the cavity plate 10 (surrounding areas of the pressure chambers 14). The cavity plate 10, to which the vibration plate 30 is joined, corresponds to the base member of the present invention. The pressure chamber 14, which is formed for the cavity plate 10, corresponds to the deformation allowable area of the present invention.

The insulating material layer 37 is formed in the area of the upper surface of the conductive vibration plate 30 opposed to the plurality of pressure chambers 14. The insulating material layer 37 can be formed of, for example, a synthetic resin material such as polyimide or an insulative ceramics material such as alumina and zirconia.

The piezoelectric layer 31 is composed of a piezoelectric material containing a main component of lead titanate zirconate (PZT) as a ferroelectric material and as a solid solution of lead titanate and lead zirconate. The piezoelectric layer 31 is formed on the upper surface of the vibration plate 30 on which the insulating material layer 37 is formed so that the plurality of pressure chambers 14 are covered therewith. The piezoelectric layer 31 can be stacked on the upper surface of the vibration plate 30 by using, for example, the aerosol deposition method (AD method), the sputtering method, the vapor deposition method, the sol-gel method, and the hydrothermal method. Alternatively, the piezoelectric layer 31 may be formed such that a piezoelectric sheet, which is obtained by calcining or sintering an unsintered green sheet, is stuck onto the upper surface of the vibration plate 30 covered with the insulating material layer 37.

Next, the first electrodes 32, the second electrodes 34, and the third electrode 36 arranged on both of the upper and lower surfaces of the piezoelectric layer 31 will be explained in detail.

As shown in FIGS. 2 to 5, the plurality of first electrodes 32 are arranged respectively in the areas of the upper surface of the piezoelectric layer 31 opposed to the central portions of the plurality of pressure chambers 14. The plurality of first electrodes 32 are arranged in two arrays in a staggered form corresponding to the plurality of pressure chambers 14 respectively. Each of the first electrodes 32 has a substantially elliptic shape which is one size smaller than the pressure chamber 14. Further, a plurality of contact sections 35, which are led (drawn) to the areas not facing the pressure chambers 14 respectively, are also formed on the upper surface of the piezoelectric layer 31, the contact section 35 extending in the longitudinal direction of the pressure chambers 14 from one end of each of the plurality of first electrodes 32.

The plurality of contact sections 35 are connected to an unillustrated driver IC via a flexible printed circuit (FPC) arranged to cover the plurality of first electrodes 32. The driver IC switches the electric potential of the first electrode 32 between two types of electric potentials, i.e., the ground electric potential (reference electric potential) and a predetermined driving electric potential different from the ground electric potential.

The third electrode 36 is formed in the substantially entire region of the upper surface of the piezoelectric layer 31 except for the areas in which the first electrodes 32 and the contact sections 35 are formed. In other words, the third electrode 36 is formed so that the third electrode 36 is separated from the first electrodes 32 in the plane direction and the third electrode 36 surrounds the first electrodes 32 in the areas facing to the circumferential edge portions of the respective pressure chambers 14 (except for the areas in which the contact sections 35 are formed). Further, portions of the third electrode 36, which face the plurality of pressure chambers 14 (first electrodes 32) respectively, mutually make conduction. Although not shown, the third electrode 36 is electrically connected to FPC described above. Further, the third electrode 36 is connected to the driver IC via FPC. The third electrode 36 is always retained at the ground electric potential by means of the driver IC.

On the other hand, the plurality of second electrodes 34, which face the plurality of first electrodes 32 respectively, are arranged in the opposing areas of the lower surface of the piezoelectric layer 31 (surface of the insulating material layer 37) facing the plurality of pressure chambers 14. The plurality of second electrodes 34 are also arranged in two arrays in a staggered form corresponding to the plurality of pressure chambers 14 respectively. The plurality of second electrodes 34 are insulated by the insulating material layer 37 from the vibration plate 30 which is composed of the metal material.

Figure 6:
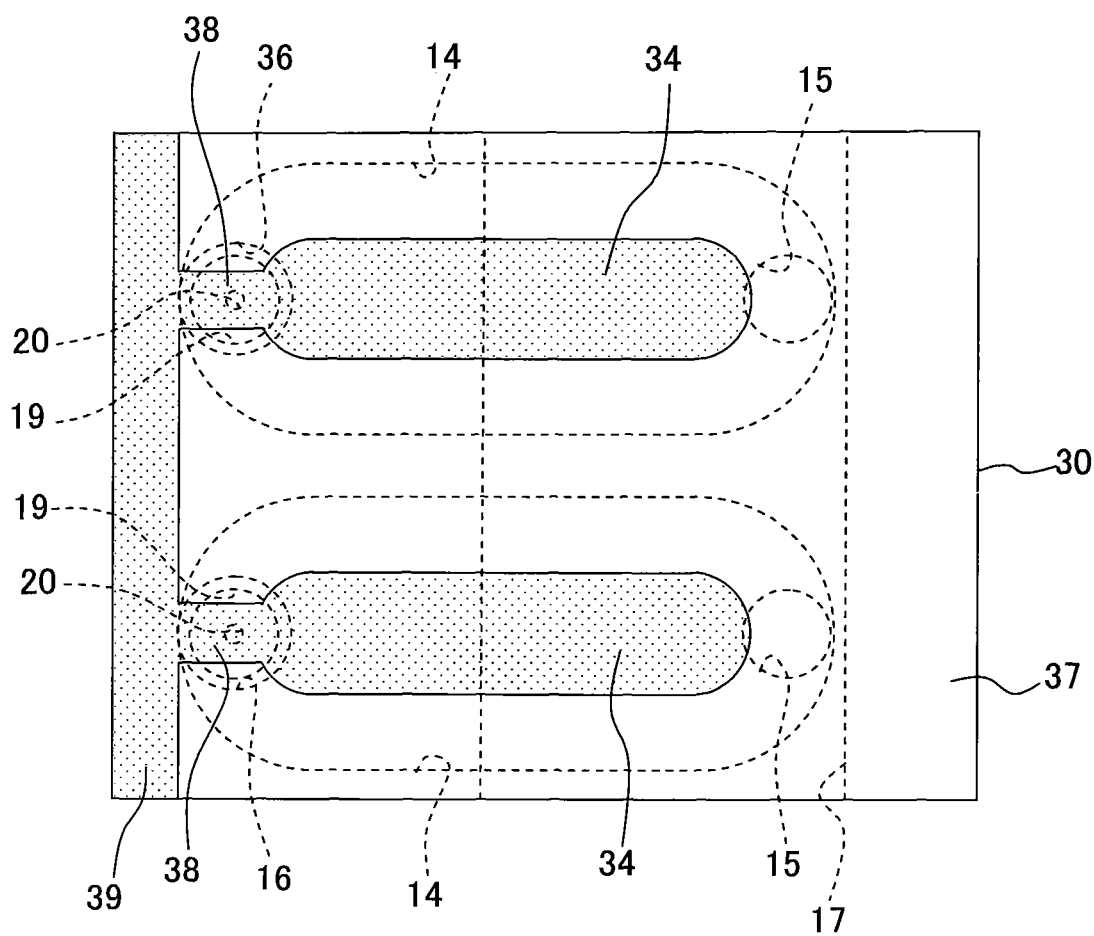
FIG. 6 shows a partial magnified plan view illustrating the ink-jet head as viewed from a position over an upper surface of an insulating material layer to cover a vibration plate.

As shown in FIGS. 2, 3, and 6, each of the second electrodes 34 has a substantially elliptic planar shape which is further one side smaller than the corresponding first electrode 32. The second electrode 34 is arranged to be accommodated in the area facing the first electrode 32. A wiring section 38, which has a width shorter than that of the second electrode 34, is led in the longitudinal direction of the second electrodes 34 to arrive at a central portion in the left-right direction (scanning direction) as shown in FIG. 2 from one end of each of the second electrodes 34 in the longitudinal direction (end on the central side in the left-right direction as shown in FIG. 2, positioned on the side of the nozzle 20). As shown in FIG. 2, the plurality of wiring sections, which are led from the plurality of second electrodes 34 respectively, are connected to a wiring section 39 which extends in the paper feeding direction between the second electrodes 34 arranged in two arrays. Further, the wiring section 39 is led to an area, of the surface of one end of the flow passage unit 4 in the longitudinal direction (upper end as shown in FIG. 2), in which the piezoelectric layer 31 is not formed such that the wiring section 39 is exposed in the same area. A contact section 40 is provided at the exposed end.

The contact section 40 is connected to FPC described above, and thus the plurality of second electrodes 34 are connected to the driver IC via FPC. The plurality of second electrodes 34 are always retained at the ground electric potential by means of the driver IC in the same manner as the third electrode 36.

Each of the first electrode 32, the contact section 35, the second electrode 34, and the third electrode 36 is composed of a conductive material such as gold, copper, silver, palladium, platinum, and titanium. Each of the first electrode 32, the contact section 35, the second electrode 34, and the third electrode 36 is formed, for example, by means of the screen printing method, the sputtering method, or the vapor deposition method. All of the first electrode 32, the contact section 35, and the third electrode 36 are arranged on the upper surface of the piezoelectric layer 31. Therefore, they can be formed simultaneously, for example, by means of the screen printing.

Figure 7:
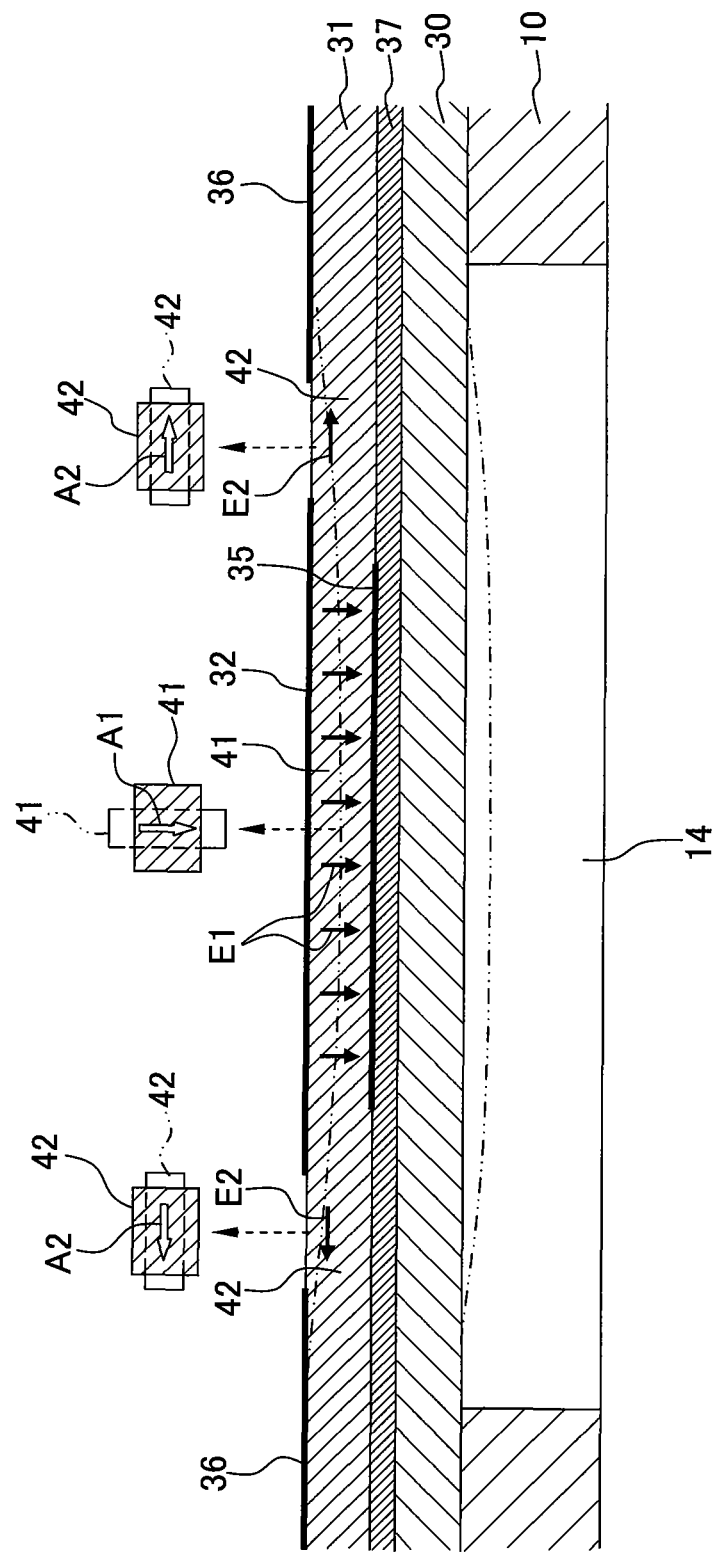
FIG. 7 shows a partial magnified sectional view illustrating a piezoelectric actuator to depict the directions of polarization and the directions of electric fields allowed to act on a piezoelectric layer.

As explained above, the first electrodes 32 and the second electrodes 34 are arranged respectively on the upper and lower surfaces of the portions of the piezoelectric layer 31 opposed to the central portions of the pressure chambers 14, and the first electrodes 32 and the second electrodes 34 are opposed to one another. Therefore, when the positive driving voltage is applied to the first electrodes 32, as shown in FIG. 7, the electric field E1, which is directed downwardly, is generated in parallel to the thickness direction at the portion (hereinafter referred to as "first driving section 41" as well) interposed between the first electrode 32 and the second electrode 34 which is always retained at the ground electric potential.

The third electrode 36 is arranged on the upper surface of the portion opposed to the circumferential edge portions of the pressure chambers 14. Therefore, when the driving voltage is applied to the first electrode 32, as shown in FIG. 7, the electric field E2, which is directed to the outside of the pressure chamber 14, is generated in parallel to the plane direction at the portion (hereinafter referred to as "second driving section 42" as well) positioned between the first electrode 32 and the third electrode 36 which is always retained at the ground electric potential.

Further, the direction of polarization also differs between the first driving section 41 and the second driving section 42, the first driving section of the piezoelectric layer 31 being interposed by the first electrode 32 and the second electrode 34 opposed to one another, and the second driving section 42 being positioned between the first electrode 32 and the third electrode 36 in the plane direction. Specifically, as shown in FIG. 7, the first driving section 41 of the piezoelectric layer 31 is polarized to possess the polarization component A1 which is directed downwardly and which is parallel to the thickness direction of the piezoelectric layer 31 (parallel to the electric field E1). On the other hand, the second driving section 42 of the piezoelectric layer 31 is polarized to possess the polarization component A2 which is directed to the outside of the pressure chamber 14 and which is parallel to the plane direction of the piezoelectric layer 31 (parallel to the electric field E2). The polarization state of the piezoelectric layer 31 as described above can be realized such that the electric potential difference, which is higher than the electric potential difference to be brought about during the driving (electric potential difference between the driving electric potential and the ground electric potential), is applied between the first electrode 32 and other electrodes (the second electrode 34 and the third electrode 36), and the strong electric fields are allowed to act on the first driving section 41 and the second driving section 42 respectively.

Next, an explanation will be made about the action of the piezoelectric actuator 5 during the ink jetting operation. When the ink droplets are jetted from a certain nozzle 20, the driving electric potential is applied from the driver IC to the first electrode 32 corresponding to the pressure chamber 14 communicated with the nozzle 20.

Accordingly, as shown in FIG. 7, the electric potential difference arises in the first driving section 41 of the piezoelectric layer 31 between the first electrode 32 to which the driving electric potential is applied and the second electrode 34 which is retained at the ground electric potential. The electric field E1, which is parallel to the thickness direction (directed downwardly), is allowed to act on the first driving section 41. The first driving section 41 is polarized so that the first driving section 41 has the polarization component A1 which is parallel to the thickness direction. Therefore, in the first driving section 41, the direction of the electric field is the same as the direction of polarization. Therefore, as shown by two-dot chain lines in FIG. 7, the first driving section 41 is elongated or expanded in the thickness direction, and it is shrunk in the plane direction. In accordance with the shrinkage deformation of the first driving section 41, the portion of the vibration plate 30, which faces the pressure chamber 14, is deformed to be convex toward the side of the pressure chamber 14 (unimorph deformation).

Additionally, the electric potential difference arises in the second driving section 42 of the piezoelectric layer 31 between the first electrode 32 to which the driving electric potential is applied and the third electrode 36 which is retained at the ground electric potential. As shown in FIG. 7, the electric field E2, which is parallel to the plane direction (directed to the outside of the pressure chamber 14), is allowed to act on the second driving section 42. The second driving section 42 is polarized to have the polarization component A2 which is parallel to the in-plane direction. Therefore, in the second driving section 42, the direction of the electric field is the same as the direction of polarization. Therefore, as shown by two-dot chain lines in FIG. 7, the second driving section 42 is elongated in the plane direction, and it is shrunk in the thickness direction. As described above, the first driving section 41, which is opposed to the central portion of the pressure chamber 14, is shrunk in the plane direction. Additionally, the second driving section 42, which is disposed therearound, is elongated in the plane direction. Accordingly, the convex deformation of the vibration plate 30 (displacement toward the side of the pressure chamber 14) is further increased.

As described above, the second electrode 34 has the shape which is one size smaller than the first electrode 32. The second electrode 34 is arranged to be accommodated in the area of the lower surface of the piezoelectric layer 31 opposed to the first electrode 32. Therefore, the electric field E1, which is directed from the first electrode 32 to the second electrode 34, is prevented from being spread (diffused) in the plane direction to cause any interference with the electric field E2 which is parallel to the plane direction and which is generated between the first electrode 32 and the third electrode 36.

The insulating material layer 37 is allowed to intervene between the vibration plate 30 and the piezoelectric layer 31. Therefore, any external electric field, which is distinct from the electric fields E1, E2 generated by the three types of the electrodes 32, 34, 36, is prevented from being applied to the piezoelectric layer 31 through the vibration plate 30 from the downward position to cause any interference with the electric fields E1, E2.

When the vibration plate 30 is deformed to be convex toward the side of the pressure chamber 14 as described above, then the volume of the pressure chamber 14 is decreased, and the pressure is applied to the ink contained in the pressure chamber 14. The ink droplets are jetted from the nozzle 20 communicated with the pressure chamber 14.

The following effect is obtained with the ink-jet head 1 of this embodiment explained above. When the driving electric potential is applied to the first electrode 32, the shrinkage deformation in the plane direction is generated in the first driving section 41 opposed to the central portion of the pressure chamber 14, of the portion of the piezoelectric layer 31. Simultaneously, the elongation deformation is generated in the plane direction in the second driving section 42 disposed therearound. When the mutually different types of deformation are generated respectively in the first driving section 41 and the second driving section 42 as described above, the vibration plate 30 can be deformed more greatly. In other words, the vibration plate 30 can be greatly deformed while suppressing the electric potential difference between the first electrode 32 and other electrodes (the second electrode 34 and the third electrode 36) to be low. The driving efficiency of the piezoelectric actuator 5 is improved.

The electric potential of the first electrode 32 is switched between the ground electric potential (reference electric potential) and the driving electric potential. On the other hand, both of the electric potentials of the second electrode 34 and the third electrode 36 are retained at the ground electric potential as the reference electric potential of the first electrode 32. Accordingly, it is possible to decrease the types of the electric potentials to be applied to the three types of the electrodes 32, 34, 36. It is possible to reduce the cost required for the electrical energy transmission system including, for example, the power source and the wirings.

Next, modified embodiments, in which various modifications are applied to the embodiment described above, will be explained. However, the components or parts, which are constructed in the same manner as those of the embodiment described above, are designated by the same reference numerals, any explanation of which will be appropriately omitted.

Figure 8:
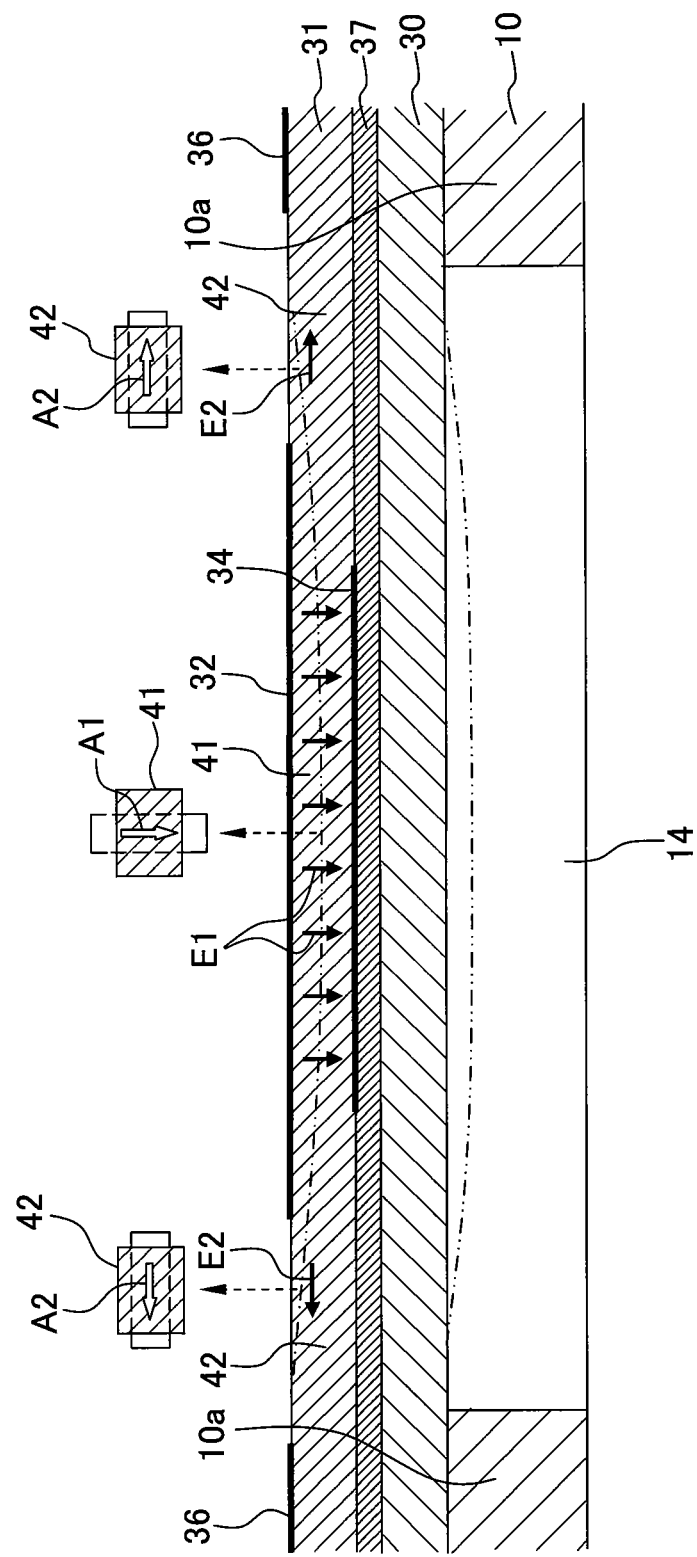
FIG. 8 shows a partial magnified sectional view illustrating a piezoelectric actuator 5A of a first modified embodiment.

In the piezoelectric actuator 5 according to the embodiment described above, the third electrode 36 is formed to extend to the area of the lower surface of the piezoelectric layer 31 opposed to the circumferential edge portions of the pressure chambers 14 (see FIG. 7). However, it is not necessarily indispensable that the third electrode 36 is disposed at the position opposed to the pressure chamber 14, provided that the electric field, which is parallel to the plane direction, can be generated in the surrounding area of the first electrode 32. That is, as in a piezoelectric actuator 5A according to a first modified embodiment shown in FIG. 8, a third electrode 36 may be formed in only a surrounding area of the first electrode 32, the area being disposed more outwardly from the edge of the pressure chamber 14 (area opposed to the partition wall 10a partitioning the pressure chamber 14).

Figure 9:
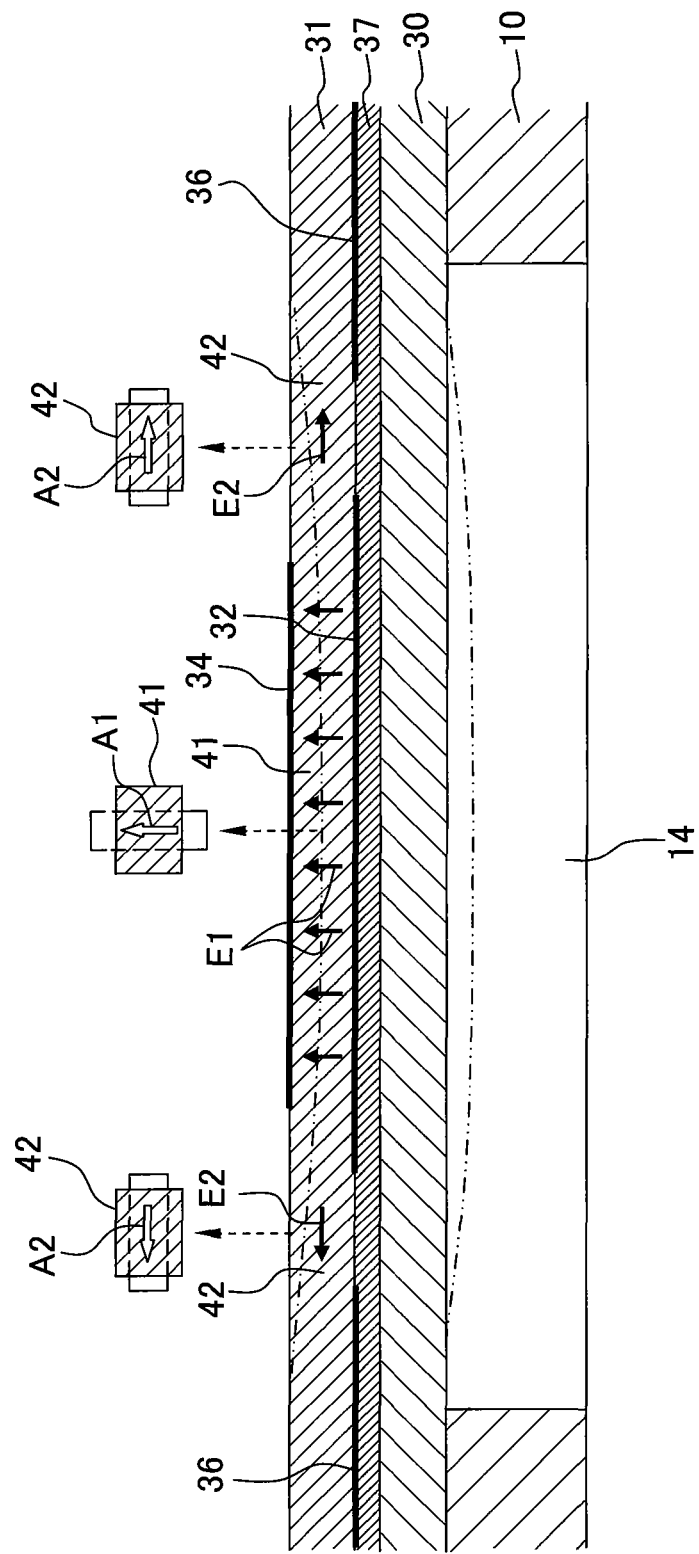
FIG. 9 shows a partial magnified sectional view illustrating a piezoelectric actuator 5B of a second modified embodiment.

As in a piezoelectric actuator 5B according to a second modified embodiment shown in FIG. 9, a first electrode 32 and a third electrode 36 may be arranged on the lower surface of the piezoelectric layer 31, and a second electrode 34 may be arranged on the upper surface of the piezoelectric layer 31. In this arrangement, the first driving section 41 of the piezoelectric layer 31, which is interposed between the first electrode 32 and the second electrode 34, is polarized to possess the polarization component A1 which is directed upwardly. When the driving electric potential is applied to the first electrode 32, and the electric field E1, which is directed upwardly, is allowed to act on the first driving section 41, then the first driving section 41 is elongated in the thickness direction, and it is shrunk in the plane direction, because the direction of the electric field is equal to the direction of polarization.

On the other hand, the second driving section 42 of the piezoelectric layer 31, which is positioned between the first electrode 32 and the third electrode 62 in the plane direction, is polarized to possess the polarization component A1 which is directed to the outside of the pressure chamber 14. When the electric field E2, which is directed to the outside of the pressure chamber 14, is allowed to act when the driving electric potential is applied to the first electrode 32, then the second driving section 42 is elongated in the plane direction, and it is shrunk in the thickness direction, because the direction of the electric field is equal to the direction of polarization. As described above, the mutually different types of deformation arise in the first driving section 41 and the second driving section 42. Therefore, as shown by two-dot chain lines in FIG. 9, the vibration plate 30 and the piezoelectric layer 31 are greatly deformed to be convex toward the pressure chamber 14.

Figure 10:
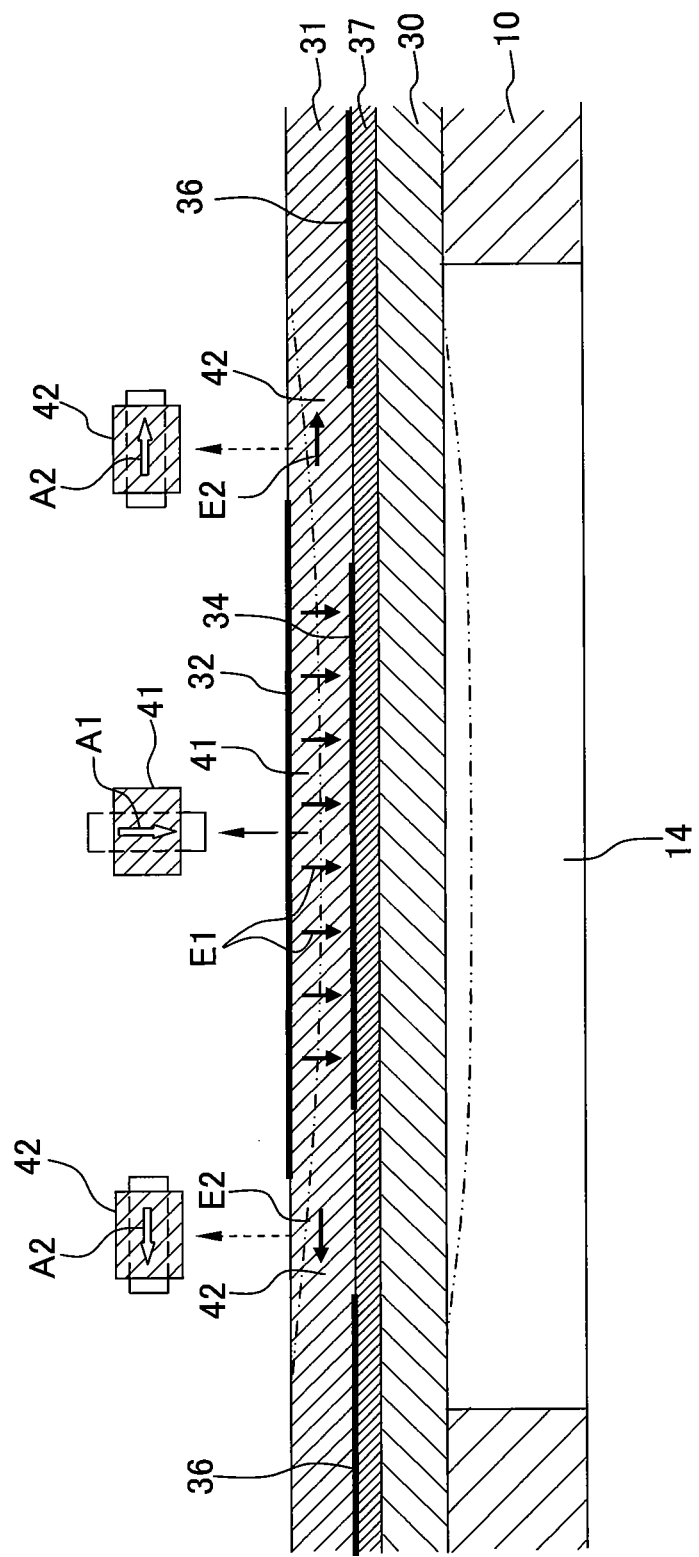
FIG. 10 shows a partial magnified sectional view illustrating a piezoelectric actuator 5C of a third modified embodiment.

The first electrode 32 and the third electrode 36 may be arranged on the different surfaces of the piezoelectric layer 31 respectively. For example, as in a piezoelectric actuator 5C according to a third modified embodiment shown in FIG. 10, a first electrode 32 may be arranged on the upper surface of the piezoelectric layer 31, and a third electrode 36 may be arranged on the lower surface of the piezoelectric layer 31 in the same manner as the second electrode 34. In this arrangement, the second electrode 34 and the third electrode 36 can be formed simultaneously on the lower surface of the piezoelectric layer 31 by using any method including, for example, the screen printing.

In the arrangement represented by the piezoelectric actuator 5C according to the third modified embodiment, the second driving section 42 of the piezoelectric layer 31, which is positioned between the first electrode 32 and the third electrode 36 in the plane direction, is polarized to possess the polarization component A1 which is parallel to the plane direction. When the driving electric potential is applied to the first electrode 32, the electric field E2, which is directed to the outside of the pressure chamber 14 and which is parallel to the plane direction, is allowed to act on the second driving section 42. Therefore, the direction of the electric field is parallel to the direction of polarization, and the second driving section 42 is elongated in the plane direction. Therefore, the function and the effect, which are the same as those obtained in the embodiment described above, are also obtained in the piezoelectric actuator 5C according to the third modified embodiment.

Figure 11:
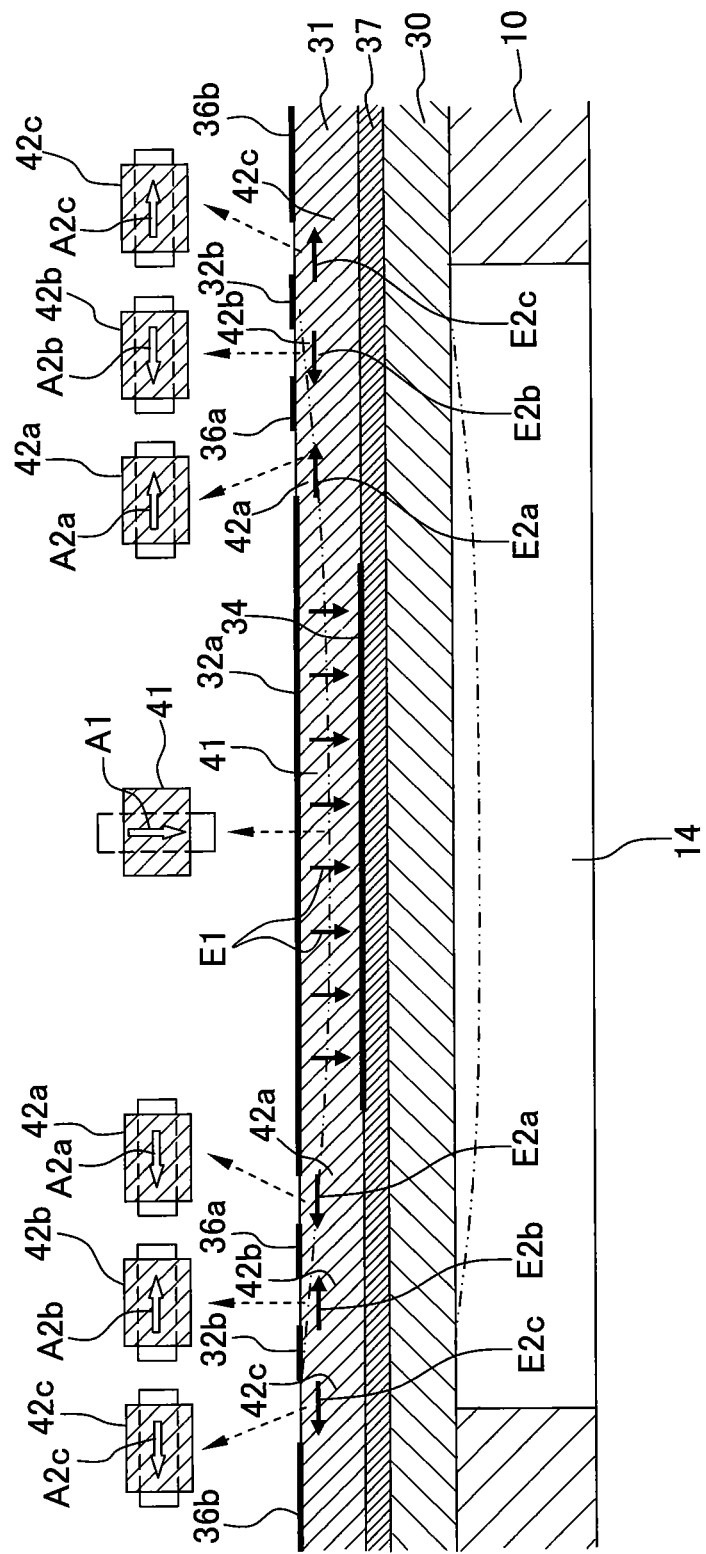
FIG. 11 shows a partial magnified sectional view illustrating a piezoelectric actuator 5D of a fourth modified embodiment.

As in a piezoelectric actuator 5D according to a fourth modified embodiment shown in FIG. 11, first electrodes 32 (32a, 32b) to which the driving electric potential is to be applied and third electrodes 36 (36a, 36b) which are to be retained at the ground electric potential may be alternately arranged while providing spacing distances in the plane direction of the piezoelectric layer 31. The portions of the piezoelectric layer 31 (second driving sections 42a to 42c), which are respectively positioned between the first electrodes 32 (32a, 32b) and the third electrodes 36 (36a, 36b) arranged alternately, are polarized to possess the polarization components (A2a to A2c) which are parallel to the plane direction. However, the directions of polarization are opposite to one another between the adjoining second driving sections 42. When the driving electric potential is applied to the first electrodes 32, the electric fields E2a to E2c, which have the same directions as those of the polarization components A2a to A2c parallel to the plane direction, are generated respectively in the plurality of second driving sections 42a to 42c positioned between the first electrodes 32 and the third electrodes 36. The second driving sections 42a to 42c are elongated in the plane direction respectively, and they are shrunk in the thickness direction.

The spacing distance in the plane direction between the first electrode 32 and the third electrode 36 is narrowed in the piezoelectric actuator 5D as compared with the piezoelectric actuator 5. Therefore, the electric fields E2a to E2c in the plane direction, which are allowed to act on the plurality of second driving sections 42a to 42c positioned between the first electrodes 32 and the third electrodes 36 respectively, are strengthened. Therefore, the second driving sections 42a to 42c can be deformed more greatly. It is possible to further enhance the driving efficiency of the piezoelectric actuator.

As in a piezoelectric actuator 5E according to a fifth modified embodiment shown in FIG. 12, first electrodes 52 and second electrodes 54 may be arranged on the both surfaces of the area of the piezoelectric layer 31 opposed to the circumferential edge portions of the pressure chambers 14, and a third electrode 56 may be arranged in the area opposed to the central portion of the pressure chamber 14.

The portion (first driving section 61) of the piezoelectric layer 31, which is opposed to the circumferential edge portion of the pressure chamber 14 and which is interposed by the first electrode 52 and the second electrode 54, is polarized to possess the polarization component A3 which is directed downwardly and which is parallel to the thickness direction. The portion (second driving section 62), which is disposed on the central side of the pressure chamber 14 and which is positioned between the first electrode 52 and the third electrode 56 in relation to the in-plane direction, is polarized to possess the polarization component A4 which is directed to the outside of the pressure chamber 14 and which is parallel to the plane direction.

When the driving electric potential is applied to the first electrode 52, the electric field E3, which is directed downwardly and which is parallel to the thickness direction, is allowed to act on the first driving section 61 opposed to the circumferential edge portion of the pressure chamber 14. The first driving section 61 is elongated in the thickness direction, and it is shrunk in the plane direction. On the other hand, the electric field E4, which is directed to the outside of the pressure chamber 14 and which is parallel to the plane direction, is allowed to act on the second driving section 62 positioned on the central side of the pressure chamber 14. The second driving section 62 is elongated in the plane direction, and it is shrunk in the thickness direction. As described above, the first driving section 61 is shrunk in the plane direction, and the second driving section 62 is elongated in the plane direction. Accordingly, as shown by two-dot chain lines in FIG. 12, the vibration plate 30 can be greatly deformed to be convex toward the side opposite to the pressure chamber 14.

The combination of the electric potentials to be applied to the three types of the electrodes is not limited to the combination of the embodiment described above provided that the electric field, which is parallel to the thickness direction, is successfully allowed to act on the first driving section interposed between the first electrode and the second electrode, and the electric field, which is parallel to the in-plane direction, is successfully allowed to act on the second driving section positioned between the first electrode and the third electrode. For example, the electric potential of the second electrode may be different from that of the third electrode. Alternatively, the piezoelectric actuator may be constructed such that the electric fields are allowed to act on the first driving section and the second driving section by applying, to the first electrode, any electric potential lower than the electric potentials of the second electrode and the third electrode.

In the embodiment described above, the vibration plate 30 is formed of the metal material. Therefore, the insulating material layer 37, which effects the insulation between the vibration plate 30 and the electrode 34, is allowed to intervene between the vibration plate 30 and the electrode (second electrode 34) arranged on the lower surface of the piezoelectric layer 31 (see FIG. 7). However, when the upper surface of the vibration plate is an insulative surface, for example, when the vibration plate is formed of an insulative material (for example, a synthetic resin material such as polyimide or a ceramics material such as alumina and zirconia), then it is unnecessary to provide the insulating material layer. When the vibration plate itself has the insulating property as described above, any external electric field, which is distinct from the electric fields generated by the three types of the electrodes, is reliably prevented from being applied to the piezoelectric layer through the vibration plate. In the embodiment described above, the piezoelectric layer has a single piezoelectric layer. However the invention is not limited to this. The invention is applicable to the piezoelectric actuator having piezoelectric layer of multi layer. When the piezoelectric actuator has the single piezoelectric layer, the stiffness of the piezoelectric layer can be reduced compared to the case of the multi-piezoelectric layer. Accordingly, the drive efficiency of the piezoelectric actuator can be enhanced.

The present invention has been explained as exemplified by the illustrative embodiments of the present invention in which the present invention is applied to the piezoelectric actuator of the ink-jet head for applying the jetting pressure to the ink contained in the pressure chamber. However, the applicable objective of the present invention is not limited thereto. For example, the present invention is also applicable to any piezoelectric actuator to be used as the liquid transport actuator including, for example, a liquid transport apparatus for transporting a liquid such as a reagent solution and/or a biochemical solution in a micro total analysis system (µTAS), and a liquid transport apparatus for transporting a liquid such as a solvent and/or a chemical solution in a micro chemical system.

Further, the applicable objective of the present invention is not limited to the actuator for applying the pressure to the liquid such as the ink. That is, the present invention is also applicable to any piezoelectric actuator to be used for any way of use other than the liquid transport, including, for example, an actuator for pressing and driving various objectives in accordance with the deformation of a stack while allowing the deformation of the stack in the deformation allowable area formed in the base member.

What is claimed is:

1. A piezoelectric actuator comprising:
a vibration plate which is deformable;
a base member which has a deformation acceptable section in which a deformation of the vibration plate is acceptable, and a surrounding area, surrounding the deformation acceptable section, on which the vibration plate is joined to cover the deformation acceptable section;
a piezoelectric layer arranged on one surface of the vibration plate over the deformation acceptable section;
a first electrode arranged in a first area of one surface of the piezoelectric layer, the first area facing the deformation acceptable section;
a second electrode arranged in a second area of the other surface of the piezoelectric layer, the second area facing the first electrode; and
a third electrode arranged in a third area, the third area being an area of the one surface of the piezoelectric layer different from the first area or being an area of the other surface of the piezoelectric layer different from the second area,
wherein a first portion and a second portion of the piezoelectric layer are overlapped with the deformation acceptable section, the first portion being interposed by the first electrode and the second electrode in a thickness direction of the piezoelectric layer, and the second portion being interposed by the first electrode and the third electrode in a plane direction of the piezoelectric layer,
wherein the first portion of the piezoelectric layer is polarized in parallel to the thickness direction, and the second portion of the piezoelectric layer is polarized in parallel to the plane direction,
wherein one of the first and third areas faces a central portion of the deformation acceptable section, and
wherein the other of the first and third areas faces the surrounding area, and the other of the first and third areas circumferentially surrounds the central portion of the deformation acceptable section in a plane parallel to the piezoelectric layer in an undeformed state.

2. The piezoelectric actuator according to claim 1, wherein the third electrode is formed in an local area which is included in the third area of the piezoelectric layer and which faces the deformation acceptable section; and
an electric field parallel to the thickness direction of the piezoelectric layer is generated in the first portion of the piezoelectric layer and an electric field parallel to the plane direction of the piezoelectric layer is generated in the second portion of the piezoelectric layer when an electric potential of the first electrode is different from an electric potential of the second electrode and an electric potential of the third electrode.

3. The piezoelectric actuator according to claim 2, wherein the second electrode is arranged on the other surface of the piezoelectric layer to be accommodated in an area facing the first electrode.

4. The piezoelectric actuator according to claim 2,
wherein the vibration plate is formed of a metal material; and
an insulating material layer is arranged between the vibration plate and the piezoelectric layer.

5. The piezoelectric actuator according to claim 2,
wherein the first area of the piezoelectric layer faces the central portion of the deformation acceptable section; and
the third area surrounds the first area and faces a circumferential edge portion of the deformation acceptable section.

6. The piezoelectric actuator according to claim 2,
wherein the first area of the piezoelectric layer faces a circumferential edge portion of the deformation acceptable section and surrounds the central portion of the deformation acceptable section; and
the third area faces the central portion of the deformation acceptable section surrounded by the first area.

7. The piezoelectric actuator according to claim 2, wherein the third electrode is arranged on the one surface of the piezoelectric layer together with the first electrode.

8. The piezoelectric actuator according to claim 2, wherein the third electrode is arranged on the other surface of the piezoelectric layer together with the second electrode.

9. The piezoelectric actuator according to claim 2, further comprising:
a power source which applies, to the first, second, and third electrodes, a predetermined reference electric potential or a driving electric potential which is different from the reference electric potential, wherein the power source switchably applies the reference electric potential and the driving electric potential to the first electrode, and applies the reference electric potential to the second and third electrodes at all times.

10. The piezoelectric actuator according to claim 2, wherein the first electrode and the third electrodes are formed as a plurality of first electrodes and third electrodes, respectively, and the first electrodes and the third electrodes are arranged alternately at spacing distances therebetween in the plane direction of the piezoelectric layer.

11. The piezoelectric actuator according to claim 1, wherein the first electrode is arranged in a facing area, of the first area of the piezoelectric layer, facing a central portion of the deformation acceptable section;
the third electrode is arranged around the first electrode in the third area of the piezoelectric layer; and
an electric field parallel to the thickness direction of the piezoelectric layer is generated in the first portion of the piezoelectric layer and an electric field parallel to the plane direction of the piezoelectric layer is generated in the second portion of the piezoelectric layer when an electric potential of the first electrode is different from an electric potential of the second electrode and an electric potential of the third electrode.

12. The piezoelectric actuator according to claim 1, wherein the piezoelectric layer is formed of a single layer.

13. The piezoelectric actuator according to claim 1, wherein the third electrode includes a plurality of individual electrodes aligned in the plane direction of the piezoelectric layer, and a portion of the piezoelectric layer, which is interposed by two individual electrodes among the individual electrodes arranged adjacently in the plane direction, is polarized in parallel to the plane direction.

14. The piezoelectric actuator according to claim 1, wherein the third electrode is coextensive with the third area.

15. A piezoelectric actuator comprising:
a vibration plate which is deformable;
a base member which has a deformation acceptable section in which a deformation of the vibration plate is acceptable, and a surrounding area, surrounding the deformation acceptable section, on which the vibration plate is joined to cover the deformation acceptable section;
a piezoelectric layer arranged on one surface of the vibration plate over the deformation acceptable section;
a first electrode arranged in a first area of one surface of the piezoelectric layer, the first area facing a central portion of the deformation acceptable section;
a second electrode arranged in a second area of the other surface of the piezoelectric layer, the second area facing the first electrode; and
a third electrode arranged in a third area, the third area being an area of the one surface of the piezoelectric layer different from the first area or being an area of the other surface of the piezoelectric layer different from the second area, the third area facing the surrounding area, and the third area circumferentially surrounding the central portion of the deformation acceptable section in a plane parallel to the piezoelectric layer in an undeformed state,
wherein a first portion and a second portion of the piezoelectric layer are overlapped with the deformation acceptable section, the first portion being interposed by the first electrode and the second electrode in a thickness direction of the piezoelectric layer, and the second portion being interposed by the first electrode and the third electrode in a plane direction of the piezoelectric layer; and
the first portion of the piezoelectric layer is polarized in parallel to the thickness direction, and the second portion of the piezoelectric layer is polarized in parallel to the plane direction.

16. The piezoelectric actuator according to claim 15, wherein the third electrode is coextensive with the third area.

* * * * *